United States Patent [19]
Thomas et al.

[11] 4,001,605
[45] Jan. 4, 1977

[54] VOTER CIRCUIT INCLUDING AVERAGING MEANS

[75] Inventors: Francis J. Thomas, West Paterson; Albert Kirchhein, Montvale; Donald J. Porawski, Bayonne, all of N.J.

[73] Assignee: The Bendix Corporation, Teterboro, N.J.

[22] Filed: Sept. 29, 1975

[21] Appl. No.: 617,548

[52] U.S. Cl. .................. 307/235 F; 307/235 G; 328/137; 328/117; 328/147; 235/193
[51] Int. Cl.² .................. H03K 5/20; G06G 7/12
[58] Field of Search ....... 307/235 R, 235 F, 235 G, 307/203, 211; 328/92, 96, 115–117, 137, 146, 147; 235/193

[56] References Cited
UNITED STATES PATENTS

| | | | |
|---|---|---|---|
| 3,551,824 | 12/1970 | Rotier | 307/235 F |
| 3,596,107 | 7/1971 | Kittrell | 307/235 G |
| 3,609,565 | 9/1971 | Arnold | 328/117 X |
| 3,686,493 | 8/1972 | Schmid | 328/116 X |

Primary Examiner—John Zazworsky
Attorney, Agent, or Firm—Anthony F. Cuoco; S. H. Hartz

[57] ABSTRACT

A voter circuit with averaging means eliminates a deadzone characteristic inherent in prior art voter circuits when unvoted or unwanted input signals are near zero. Elimination of the deadzone characteristic renders the voter usable in small signal regions.

9 Claims, 2 Drawing Figures

VOTER CIRCUIT INCLUDING AVERAGING MEANS

BACKGROUND OF THE INVENTION

1. Field of the Invention

This invention relates generally to voter circuits of the type responsive to a plurality of input signals for providing a voted or wanted output signal. More particularly, this invention relates to a voter circuit of the type described including averaging means whereby a deadzone characteristic occurring when the unwanted input signals are near zero is eliminated.

2. Description of the Prior Art

Prior art voter circuits of the type having a plurality of input amplifiers responsive to corresponding input signals for providing a wanted or voted signal exhibit a deadzone characteristic when one input signal is grounded and the unwanted or unvoted signals are near zero. This deadzone characteristic is due primarily to the input amplifiers operating in a saturated mode when their respective input signals are not selected or voted for the output signal. This is particularly undesirable for low level signal applications.

SUMMARY OF THE INVENTION

This invention contemplates apparatus of the type wherein a plurality of input signals are applied through corresponding amplifiers for voting or selecting a wanted signal of a plurality of input signals for an output signal. Feedback is applied to the amplifiers in a manner such that averaging of the unselected signals takes place. The point where averaging ceases and voting occurs is determined by the following equation:

$$V_i = 3 \frac{V_{sat}}{2} \cdot \frac{R_i}{R_L}, \text{ where} \qquad (1)$$

$V_i$ is the input signal, $V_{sat}$ is the input amplifier saturation voltage, $R_i$ is the amplifier input resistance and $R_L$ is the amplifier feedback resistance.

It will thus be seen from equation (1), which will be hereinafter derived, that the range over which the voter will average will be determined by an analysis of system offsets and dynamic range. The averaging region is kept as small as practical so as not to degrade overall system performance near null conditions.

The main object of this invention is to provide a voter circuit of the type for voting upon a plurality of input signals including averaging means for eliminating a deadzone characteristic when the unvoted inputs are near zero.

Another object of this invention is to eliminate the deadzone characteristic by the application of feedback to the input amplifiers so that averaging of the unwanted signals takes place.

Another object of this invention is to provide an operating region where averaging ceases and true voting is established in accordance with an analysis of system offsets and dynamic range.

Another object of this invention is to maintain the averaging region as small as practical so as not to degrade circuit performance around null.

Another object of this invention is to provide voter circuitry which is usable with low level input signals.

The foregoing and other objects and advantages of the invention will appear more fully hereinafter from a consideration of the detailed description which follows, taken together with the accompanying drawings wherein one embodiment of the invention is illustrated by way of example. It is to be expressly understood, however, that the drawings are for illustration purposes only and are not to be construed as defining the limits of the invention.

DESCRIPTION OF THE DRAWINGS

With reference to FIG. 1, a voter circuit is shown having for purposes of illustration, three input channels 1, 2 and 3, respectively. In this connection it is to be noted that the device described is applicable to any number of input channels as will be understood by those skilled in the art.

Figure 1:
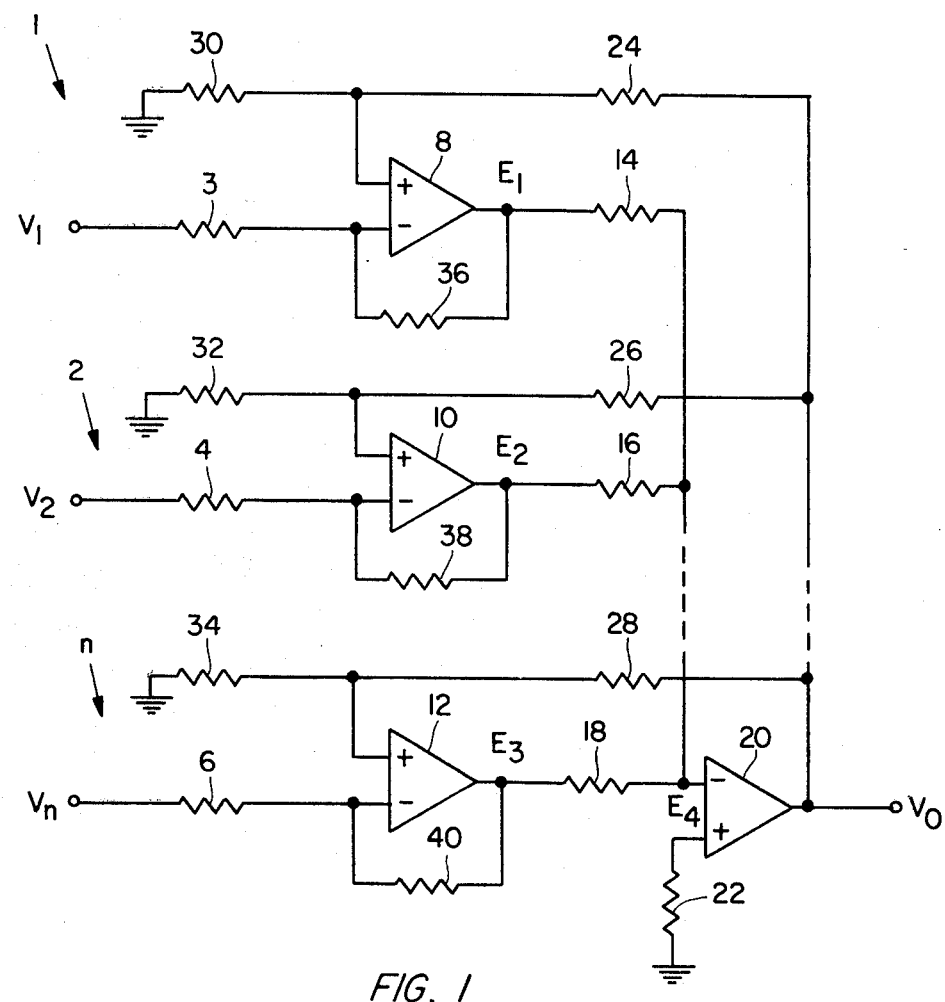
FIG. 1 is an electrical schematic diagram showing a voter circuit with averaging means according to the invention.

With this in mind and with continued reference to FIG. 1, input signals $V_1$, $V_2$ and $V_n$ are applied through resistors 3, 4 and 6 to the inverting input terminals (−) of amplifiers 8, 10 and 12, respectively. The outputs of amplifiers 8, 10 and 12 are applied through resistors 14, 16 and 18, respectively, and which resistors are of equal value to an inverting input terminal (−) of an amplifier 20. Amplifier 20 has a non-inverting input terminal (+) connected to ground through a resistor 22 and provides at an output terminal an output signal $V_0$.

The non-inverting input terminal (+) of amplifier 8 is connected through a resistor 24, the non-inverting input terminal (+) of amplifier 10 is connected through a resistor 26 and the non-inverting input terminal (+) of amplifier 12 is connected through a resistor 28 to the output terminal of amplifier 20.

The non-inverting input terminal (+) of amplifier 8 is connected to ground through a resistor 30. The non-inverting input terminal (+) of amplifier 10 is connected to ground through a resistor 32 and the non-inverting input terminal (+) of amplifier 12 is connected to ground through a resistor 34.

Figure 2:
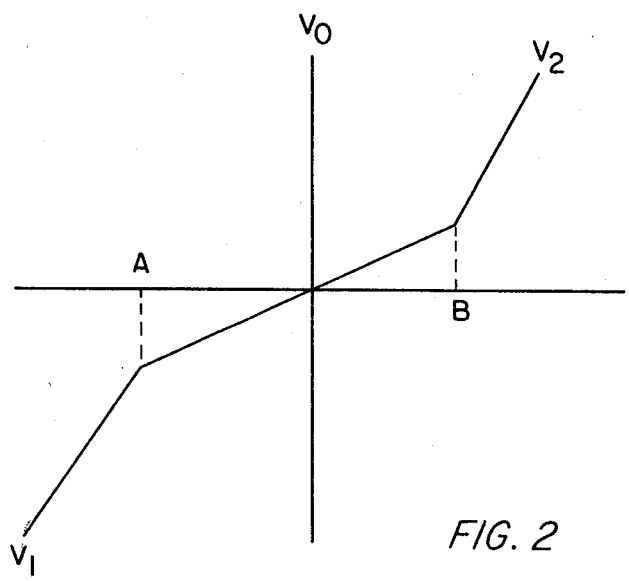
FIG. 2 is a graphical representation showing signal transfer characteristics in accordance with the invention.

As heretofore noted, in prior art voter circuits a deadzone occurs between points A and B shown in FIG. 2. This is primarily due to the fact that when one of the input signals $V_1$, $V_2$, or $V_n$ is grounded and the circuit operates to vote on or select one of the signals for an output signal, the amplifiers receiving the unselected input signals operate in a saturated mode. The deadzone characteristic is manifested by a substantially zero voltage between the points A and B. The present invention overcomes this disadvantage in applying the "local feedback" to each of the input amplifiers whereby, the deadzone characteristic is modified so that averaging of the two remaining signals takes place to provide a characteristic as shown in FIG. 2. The point where averaging ceases and true voting is reestablished is determined by equation (1) which will be hereinafter analytically developed.

This local feedback is provided by connecting resistors of appropriate value to the output terminals and the inverting input terminals (−) of the respective input amplifiers. As shown in FIG. 1, a resistor 36 is connected to the output terminal of amplifier 8 and to the inverting input terminal (−) of the amplifier. A resistor 38 is connected to the output terminal of amplifier 10 and to the inverting input terminal (−) of the amplifier, and a resistor 40 is connected to the output terminal of amplifier 12 and to the inverting input terminal (−) of the amplifier.

Equation (1) which is shown in general form will be developed for purposes of illustration, for input signal $E_1$, with it being understood that a similar analysis may be employed for the outer input signals shown in FIG. 1. Thus, in developing the equation it will be assumed that amplifier 20 operates in its linear region and all amplifier offset voltages and currents will be neglected so that for an ideal operational amplifier a voltage $E_4$ appears at the inverting input terminal (−) of amplifier 20, and which voltage $E_4$ is zero:

$$E_4 = 0. \tag{2}$$

A voltage $E_1$ appears at the output terminal of amplifier 8, a voltage $E_2$ appears at the output terminal of amplifier 10 and a voltage $E_3$ appears at the output terminal of amplifier 12. The following relationship thus applies:

$$\frac{E_1 - E_4}{R_{14}} + \frac{E_2 - E_4}{R_{16}} + \frac{E_3 - E_4}{R_{18}} = 0. \tag{3}$$

Substituting equation (2) into equation (3) the following is established when it is considered that resistors 14, 16 and 18 are of equal value as heretofore noted:

$$E_1 + E_2 + E_3 = 0. \tag{4}$$

In order for the circuit shown in FIG. 1 to be capable of averaging input signals $V_1$, $V_2$ and $V_n$, amplifiers 8, 10 and 12 must also be in their linear operating regions. Thus, the following equations apply:

$$E_1 = -V_1 \cdot \frac{R_{36}}{R_3} + V_0 \left[ 1 + \frac{R_{36}}{R_3} \right] \left[ \frac{R_{30}}{R_{30} + R_{24}} \right]. \tag{5}$$

$$E_2 = -V_2 \cdot \frac{R_{38}}{R_4} + V_0 \left[ 1 + \frac{R_{38}}{R_4} \right] \left[ \frac{R_{32}}{R_{32} + R_{26}} \right]. \tag{6}$$

$$E_3 = -V_2 \frac{R_{40}}{R_6} + V_0 \left[ 1 + \frac{R_{40}}{R_6} \right] \left[ \frac{R_{34}}{R_{34} + R_{28}} \right]. \tag{7}$$

Substituting equations (5), (6) and (7) into equation (4) the following relationship is established:

$$-V_1 \cdot \frac{R_{36}}{R_3} + V_0 \left[ 1 + \frac{R_{36}}{R_3} \right] \left[ \frac{R_{30}}{R_{30} + R_{24}} \right] - V_2 \cdot \frac{R_{38}}{R_4} + V_0 \left[ 1 + \frac{R_{38}}{R_4} \right] \left[ \frac{R_{32}}{R_{32} + R_{26}} \right] - V_3 \cdot \frac{R_{40}}{R_6} + V_0 \left[ 1 + \frac{R_{40}}{R_6} \right] \left[ \frac{R_{34}}{R_{34} + R_{28}} \right] = 0. \tag{8}$$

Simplification of equation 8 yields the following:

$$V_0 = \frac{V_1 \cdot \frac{R_{36}}{R_3} + V_2 \cdot \frac{R_{38}}{R_4} + V_3 \cdot \frac{R_{40}}{R_6}}{\left[ 1 + \frac{R_{36}}{R_3} \right]\left[ \frac{R_{30}}{R_{30} + R_{24}} \right] + \left[ 1 + \frac{R_{38}}{R_4} \right]\left[ \frac{R_{32}}{R_{32} + R_{26}} \right] + \left[ 1 + \frac{R_{40}}{R_6} \right]\left[ \frac{R_{34}}{R_{34} + R_{28}} \right]}. \tag{9}$$

In order for the input amplifier stage of the circuit to have the same weights for the three input signals $V_1$, $V_2$, and $V_n$ the following conditions must be met:

$$\frac{R_{36}}{R_3} = \frac{R_{38}}{R_4} = \frac{R_{40}}{R_6}, \tag{10}$$

$$\frac{R_{30}}{R_{30} + R_{24}} = \frac{R_{32}}{R_{32} + R_{26}} = \frac{R_{34}}{R_{34} + R_{28}}, \tag{11}$$

$$\frac{R_3 \, R_{36}}{R_3 + R_{36}} + \frac{R_{30} \, R_4}{R_{30} + R_4} ; \frac{R_4 \, R_{38}}{R_4 + R_{38}} = \frac{R_{32} \, R_{26}}{R_{32} + R_{26}} ; \text{ and}$$

$$\frac{R_6 \, R_{40}}{R_6 + R_{40}} = \frac{R_{34} \, R_{28}}{R_{34} + R_{28}}. \tag{12}$$

Substituting equations (10), (11) and (12) into equation (8), the following relationship is established:

$$V_0 = \frac{V_1 + V_2 + V_n}{3}. \tag{13}$$

From the above analysis it can be seen that output voltage $V_0$ at the output terminal of amplifier 20 is the average of the three input signals $V_1$, $V_2$ and $V_3$. Now, it must be determined as to when to discontinue averaging and return to the characteristics of the three channel voter circuit as shown in FIG. 1.

It is assumed that $V_2 + V_n = 0$. Thus, from equation 13 the following is evident:

$$V_0 = \frac{V_1}{3}. \tag{14}$$

Substituting equations (14) and (12) into equations (5), the following is obtained.

$$E_1 = -V_1 \cdot \frac{R_{36}}{R_3} + \frac{V_1}{3} \cdot \frac{R_{36}}{R_{24}};  \quad (15)$$

$$\text{but, } R_{24} = R_3 \text{ and } E_1 = \frac{-2V_1}{3} \cdot \frac{R_{36}}{R_3}, \text{ and} \quad (16)$$

when $E_1$ = the saturation voltage ($V_{sat}$) of the input amplifier, the circuit takes on the characteristic of a three channel voter, thus $$3 \frac{V_{sat}}{2} \cdot \frac{R_3}{R_{36}} = V_1, \quad (17)$$

which is recognized as the equivalent of equation (1).

Although but a single embodiment of the invention has been illustrated and described in detail, it is to be expressly understood that the invention is not limited thereto. Various changes may also be made in the design and arrangement of the parts without departing from the spirit and scope of the invention as the same will now be understood by those skilled in the art.

What is claimed is:

1. Apparatus voting on a plurality of input signals for providing an output signal, comprising:
   a plurality of amplifier means, each of which receives one of the plurality of input signals at a first input terminal and provides an output signal at an output terminal;
   other amplifier means connected at a first input terminal to the output terminal of each of the plurality of amplifier means and connected at an output terminal to a second input terminal of each of the plurality of amplifier means, and voting on the plurality of input signals for providing the output signal at said output terminal; and
   means connected to the output terminals of each of the plurality of amplifier means and to the first input terminal of each of the plurality of amplifier means for averaging the plurality of input signals over a predetermined range, with the voting occurring outside of said range.

2. Apparatus as described by claim 1, wherein the means connected to the output terminal and to the first input terminal of each of the plurality of amplifier means for averaging the plurality of input signals over a predetermined range includes:
   a plurality of resistors, each of which is connected to the output terminal and to the first input terminal of a corresponding amplifier means of the plurality of amplifier means for applying local feedback to said amplifier means.

3. Apparatus as described by claim 2, wherein the predetermined averaging range is in accordance with the following equation:

$$V_i = 3 \frac{V_{sat}}{2} \cdot \frac{R_l}{R_L}, \text{ where}$$

where $V_i$ is the input signal received by one of the plurality of amplifiers means, $V_{sat}$ is an amplifier saturation voltage, $R_l$ is an amplifier input resistance and $R_L$ is the amplifier local feedback resistance.

4. Apparatus as described by claim 1, wherein:
   the first input terminal of each of the plurality of amplifier means is an inverting terminal; and
   the second input terminal of each of the plurality of amplifier means is a non-inverting input terminal.

5. Apparatus as described by claim 1, wherein:
   the first input terminal of the other amplifier means is an inverting input terminal and
   the other amplifier means includes a grounded non-inverting input terminal.

6. Apparatus as described by claim 1, wherein:
   a plurality of resistors, each of which is connected to the first input terminal of a corresponding amplifier means of the plurality of amplifier means, with the amplifier means receiving the input signal through said resistor.

7. Apparatus as described by claim 1, including:
   a plurality of resistors, each of which is connected to the output terminal of a corresponding amplifier means of the plurality of amplifier means and to the input terminal of the other amplifier means.

8. Apparatus as described by claim 1, including:
   a plurality of resistors, each of which is connected to the second input terminal of a corresponding amplifier means of the plurality of amplifier means and to ground.

9. Apparatus as described by claim 1 wherein:
   the other amplifier means is connected at an output terminal to a second input terminal of each of the plurality of amplifier means through a corresponding plurality of resistors, each of which is connected to the second input terminal of a corresponding amplifier means of the plurality of amplifier means and connected to the output terminal of the other amplifier means.

* * * * *